US009202689B2

(12) United States Patent
Adam et al.

(10) Patent No.: US 9,202,689 B2
(45) Date of Patent: Dec. 1, 2015

(54) TRANSISTOR WITH IMPROVED SIGMA-SHAPED EMBEDDED STRESSOR AND METHOD OF FORMATION

(71) Applicant: International Business Machines Corporation, Armonk, NY (US)

(72) Inventors: Thomas N Adam, Singerlands, NY (US); Kangguo Cheng, Schenectady, NY (US); Ali Khakifirooz, Los Altos, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/311,935

(22) Filed: Jun. 23, 2014

(65) Prior Publication Data

US 2014/0302658 A1    Oct. 9, 2014

Related U.S. Application Data

(60) Continuation of application No. 14/166,326, filed on Jan. 28, 2014, now Pat. No. 8,859,376, which is a division of application No. 13/457,980, filed on Apr. 27, 2012, now Pat. No. 8,674,447.

(51) Int. Cl.
| *H01L 29/66* | (2006.01) |
| *H01L 21/02* | (2006.01) |
| *H01L 21/308* | (2006.01) |
| *H01L 21/306* | (2006.01) |
| *H01L 29/78* | (2006.01) |
| *H01L 29/165* | (2006.01) |
| *H01L 21/265* | (2006.01) |
| *H01L 21/28* | (2006.01) |
| *H01L 21/3065* | (2006.01) |

(52) U.S. Cl.
CPC ........ *H01L 21/02609* (2013.01); *H01L 21/265* (2013.01); *H01L 21/28026* (2013.01); *H01L 21/308* (2013.01); *H01L 21/3086* (2013.01); *H01L 21/30608* (2013.01); *H01L 29/165* (2013.01); *H01L 29/6653* (2013.01); *H01L 29/66431* (2013.01); *H01L 29/66575* (2013.01); *H01L 29/66636* (2013.01); *H01L 29/7848* (2013.01); *H01L 21/3065* (2013.01)

(58) Field of Classification Search
CPC ............ H01L 29/66636; H01L 21/308; H01L 21/02609
See application file for complete search history.

(56) References Cited

U.S. PATENT DOCUMENTS

| 7,391,087 B2 | 6/2008 | Murthy et al. |
| 7,670,923 B1 | 3/2010 | Nayak et al. |

(Continued)

*Primary Examiner* — Whitney T Moore
(74) *Attorney, Agent, or Firm* — Catherine Ivers

(57) ABSTRACT

A method and structure of an embedded stressor in a semiconductor transistor device having a sigma-shaped channel sidewall and a vertical isolation sidewall. The embedded stressor structure is made by a first etch to form a recess in a substrate having a gate and first and second spacers. The second spacers are removed and a second etch creates a step in the recess on a channel sidewall. An anisotropic etch creates facets in the channel sidewall of the recess. Where the facets meet, a vertex is formed. The depth of the vertex is determined by the second etch depth (step depth). The lateral position of the vertex is determined by the thickness of the first spacers. A semiconductor material having a different lattice spacing than the substrate is formed in the recess to achieve the embedded stressor structure.

20 Claims, 9 Drawing Sheets

(56) References Cited

U.S. PATENT DOCUMENTS

| | | |
|---|---|---|
| 7,994,062 B2 | 8/2011 | Wojtczak et al. |
| 8,071,442 B2 | 12/2011 | Kronholz et al. |
| 2005/0148147 A1 | 7/2005 | Keating et al. |
| 2007/0164364 A1 | 7/2007 | Kawasaki |
| 2008/0128746 A1* | 6/2008 | Wang .................. 257/190 |
| 2009/0189203 A1 | 7/2009 | Matsuo et al. |
| 2010/0025743 A1 | 2/2010 | Hoentschel et al. |
| 2010/0078689 A1 | 4/2010 | Kronholz et al. |
| 2011/0049627 A1* | 3/2011 | Chang et al. ............ 257/347 |
| 2011/0070679 A1 | 3/2011 | Borthakur et al. |
| 2011/0284968 A1 | 11/2011 | Lee et al. |

\* cited by examiner

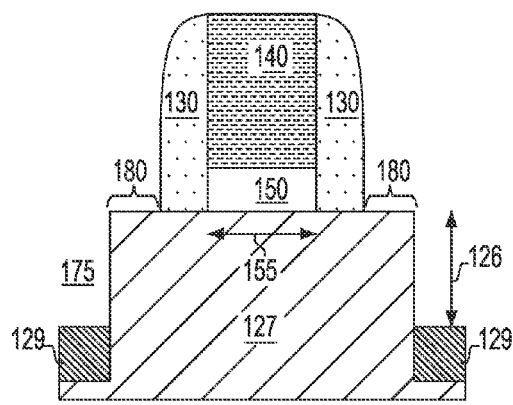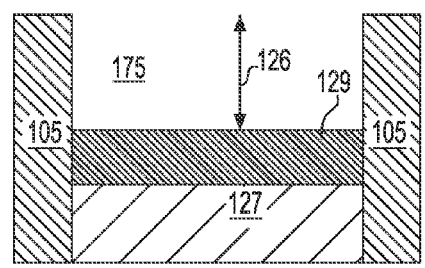
FIG. 11A  FIG. 11B
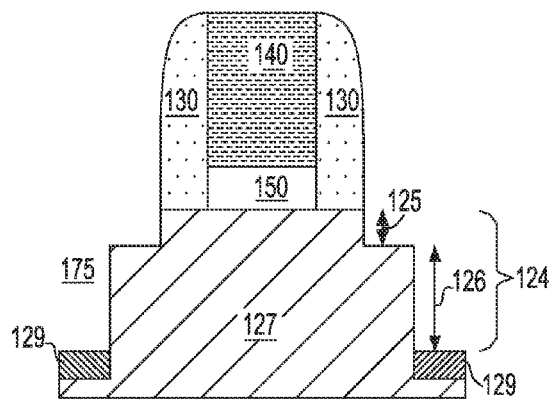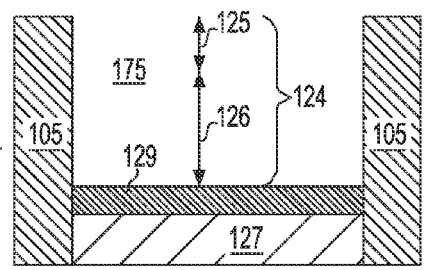
FIG. 12A  FIG. 12B

TRANSISTOR WITH IMPROVED SIGMA-SHAPED EMBEDDED STRESSOR AND METHOD OF FORMATION

CROSS-REFERENCE TO RELATED APPLICATIONS

This application is a continuation of and claims priority from co-pending U.S. application Ser. No. 14/166,326 filed on Jan. 28, 2014 which in turn is a divisional of and claims priority from U.S. Pat. No. 8,674,447 filed Apr. 27, 2012, the entire contents of both which are incorporated herein by reference.

BACKGROUND OF THE INVENTION

1. Field of the Invention

The present invention generally relates field effect transistors (FETs). In particular, the invention relates to metal oxide semiconductor FETs (MOSFETs) having a strained channel induced by an embedded stressor with a sigma shape.

2. Description of Related Art

Applying stress to the channel of a field effect transistor is desirable to increase the speed of the device. One way to apply stress is by embedding an alloy in a substrate where the alloy has a lattice constant different than that of the substrate. For example, in a silicon germanium alloy (herein "SiGe"), SiGe alloys have a larger lattice constant than a silicon substrate. Accordingly, an embedded SiGe region pushes the neighboring silicon substrate and imparts compressive stress to the device channel. To impart a tensile stress to the substrate, a silicon carbide (herein "SiC") alloy is used. SiC alloys have a smaller lattice constant compared to silicon. Accordingly, an embedded SiC region pulls the neighboring silicon substrate thus creating tensile stress in the device channel.

Referring to FIG. 1, alloys embedded in a substrate 127 of an FET device 100 usually have a rectangular shape and vertical sidewall on the channel side of the embedded alloy 122. The channel-sidewall 121 of the embedded alloy 122 is laterally offset 165 a distance from the channel 155 located under a gate dielectric 150. In FIG. 1, the lateral offset 165 happens to be equal to the width of a first spacer 130. In order to create more stress closer to the channel 155, "sigma-shaped" embedded alloy 122 structures have been proposed. Sigma-shaped structures have a vertex 160 which has a smaller lateral offset 165 from the channel 155 compared to embedded structures with a rectangular recess (Compare FIGS. 1 and 2).

The process of making the vertex 160 of a sigma-shaped embedded alloy 122 structure typically involves etching a rectangular recess in the substrate and then wet etching to form facets 128 on the sidewall (See FIG. 2). However, to create more stress a greater volume of alloy is desired, therefore a deeper recess is desired, but a deeper recess moves the vertex further away from the channel and diminishes the stress created by the vertex. Accordingly, a process which can optimize (maximize) volume of alloy and control the location of vertex (closer to the channel both laterally and vertically) is desired.

Another problem with current sigma-shaped embedded alloys will be described in conjunction with FIGS. 3, 4 and 5. FIG. 3 is a generic top down illustration of a transistor 100 surrounded by shallow trench isolation 105. Typically, there is more than one transistor 100 within the isolation 105 area, but one is shown for simplicity. The source-drain regions 120 contain the embedded alloy 122 and are separated by gate 140 having sidewall spacers 130. Cross-sections perpendicular to the gate 140 are indicated by the line A-A'. Cross-sections parallel to the gate and along the source-drain region 120 are indicated by the line B-B'. The problem stems from the fact that not only are facets 128 formed on the channel sidewall 121 of the embedded alloy 122 (as in FIG. 2 which is a cross section perpendicular to the gate 140 along A-A'), but facets 128 are also formed on the isolation sidewalls 123 of the embedded alloy 122 (as seen in FIG. 4 which is a cross section parallel to the gate 140 along B-B'). Because facets 128 exist on the isolation sidewalls 123, less volume is available for the embedded alloy 122 at the corners ("C") of the devices and as well as in narrow devices. In FIG. 3, areas labeled "C" indicate areas which will have less volume of embedded alloy 122. When there is uneven embedded alloy 122 volume along the gate 140, then non-uniform stress is applied to the channel 155. Thus, referring to FIG. 3, channel stress (and hence speed) may be high in area indicated by an arrow from A to A', whereas channel stress (and hence speed) may be low in an area indicated by an arrow from C to C. Accordingly, a process which creates a structure which provides a uniform channel stress along the gate length is required.

FIG. 5 shows an exacerbated problem of low volume when a "pyramid pit" forms in the embedded alloy 122. Here, a channel 155 width (not shown) is narrow, when the channel 155 width is less than a critical value relative to the total recess depth 124, then a pyramid pit forms. A pyramid pit means the facets 128 meet at the bottom of embedded alloy 122 such that an inverted pyramid forms rather than a flat bottomed area (compare FIGS. 5 and 4). Thus, with narrow channel devices, the total recess depth 124 is limited. Accordingly, a process which creates a narrowed channel device structure having a uniform channel stress along the gate length is required.

In summary, an embedded alloy structure and method are needed that allow freedom of vertex placement both laterally and vertically relative to a channel. Additionally, an embedded alloy structure and method are needed that provide a larger and more uniform volume of stressor material regardless of channel width. Furthermore, an embedded alloy structure and method are needed that provides uniform stress applied to a channel. Finally, an embedded alloy structure and method are needed that provides uniform stress for narrow channel devices.

SUMMARY

The general principal of the present invention is a method of making a sigma-shaped embedded alloy structure which allows freedom on vertex placement in both the lateral and vertical directions; moreover, the process creates an embedded alloy structure which has a larger volume of stressor material that uniformly fills the width of source drain area regardless of channel width. The structure substantially lacks facets along an isolation sidewall of the embedded alloy. By having control over vertex placement in both the lateral and vertical planes, stress to the channel can be optimized. By uniformly filling the source drain area, the stress exerted on the channel is uniform along the length of the device.

One aspect of the invention is a structure for a semiconductor device. The structure includes an embedded stressor having a total recess depth, a channel sidewall and an isolation sidewall. The channel sidewall has a vertex located at a vertex depth. The vertex depth is other than a midpoint of the total recess depth. The channel sidewall also has at least one facet, however, the isolation sidewall substantially lacks facets.

Another aspect of the invention is a method of making a semiconductor device. The method includes forming a recess in a substrate. The recess has a channel sidewall and an isolation sidewall. The method includes forming a pair of facets on the channel sidewall such that the facets from a vertex. In contrast, substantially no facets are formed on the isolation sidewall.

Yet another aspect of the invention is a method of making semiconductor device having an embedded stressor including a sigma-shaped channel sidewall under a gate. The method includes forming a first recess in a source drain region of a semiconductor substrate wherein the first recess has a first depth; modifying a bottom of the first recess by ion implantation; removing a mask and further etching to a second depth, different from the first depth, by vertical etch. Then, anisotropic etching to form a pair of facets under the gate. Followed by removing the modified recess bottom after the anisotropic etch; and forming an alloy in the recess having vertical sidewalls adjacent isolation regions and sigma-shaped sidewalls under the gate with a vertex of the sigma-shape being at a vertex depth less than one-third of a total recess depth.

BRIEF DESCRIPTION OF THE DRAWINGS

FIG. 11A illustrates a cross-section of a substrate perpendicular to a gate of an FET after mask (second spacer) removal according an embodiment of a method step in the present invention;

FIG. 11B illustrates a cross-section parallel to a gate of an FET along a source-drain region of the substrate after mask (second spacer) removal according an embodiment of a method step in the present invention;

FIG. 12A illustrates a cross-section of a substrate perpendicular to a gate of an FET after second etch according an embodiment of a method step in the present invention;

FIG. 12B illustrates a cross-section parallel to a gate of an FET along a source-drain region of the substrate after a second etch according an embodiment of a method step in the present invention;

Other objects, aspects and advantages of the invention will become obvious in combination with the description of accompanying drawings, wherein the same number represents the same or similar parts in all figures.

DETAILED DESCRIPTION OF EMBODIMENTS

Figure 6A:
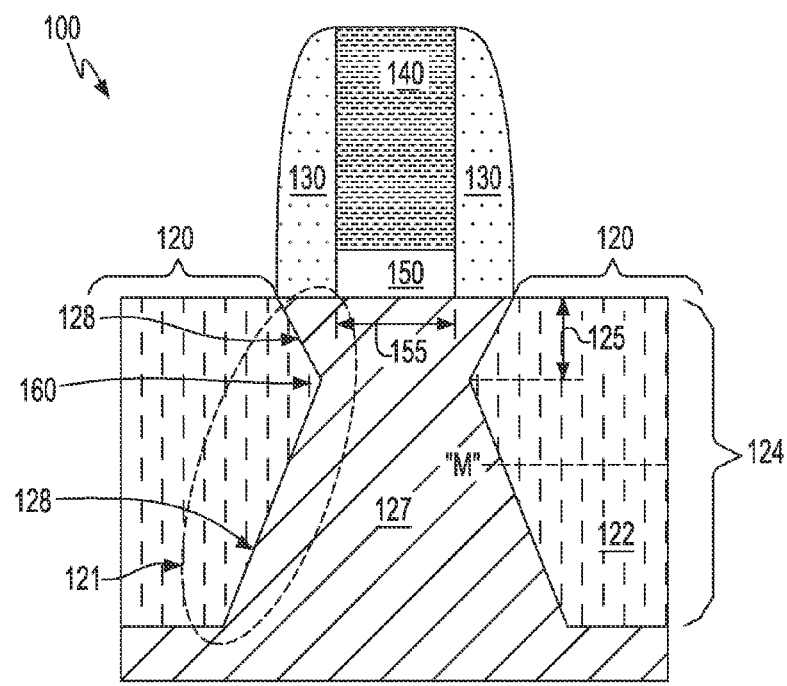
FIG. 6A illustrates a cross-section perpendicular to a gate of an FET having a sigma-shaped embedded stressor according to an embodiment of the present invention.
Figure 6B:
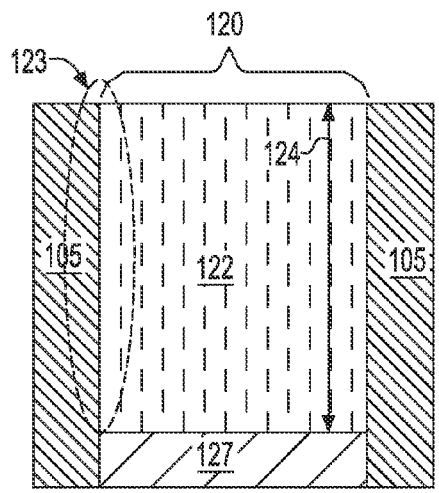
FIG. 6B illustrates a cross-section parallel to a gate along the source-drain of an FET having a sigma-shaped embedded stressor according to an embodiment of the present invention.
Figure 6C:
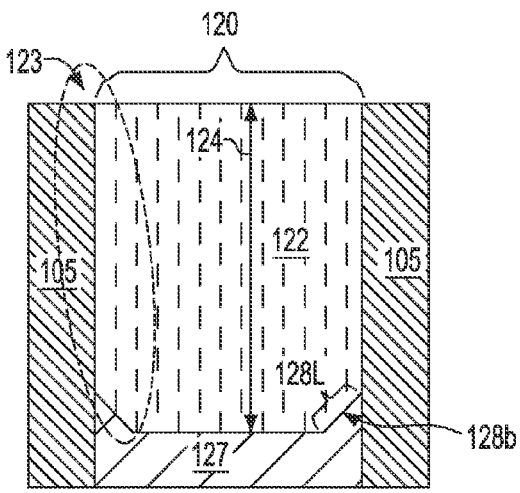
FIG. 6C illustrates a cross-section parallel to a gate along the source-drain of an FET having a sigma-shaped embedded stressor according to an embodiment of the present invention.
Figure 7:
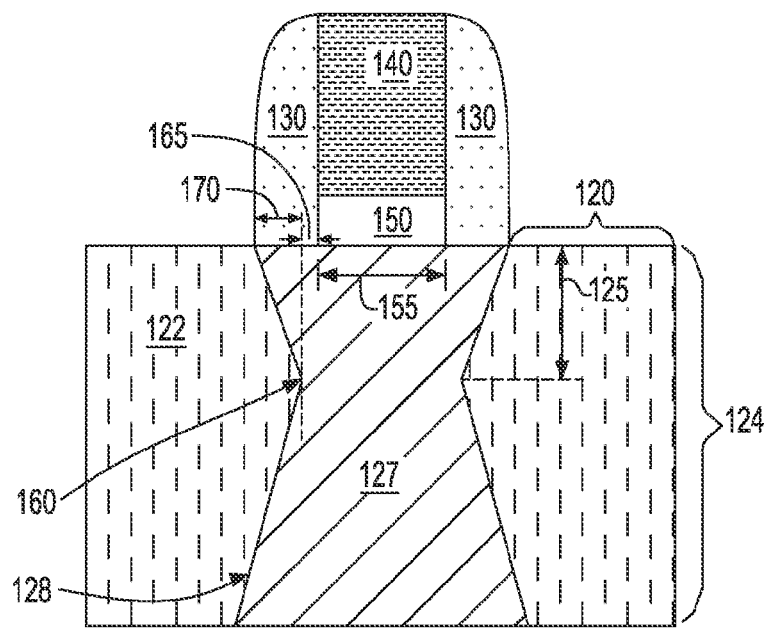
FIG. 7 illustrates a magnified portion of FIG. 6A.

Various embodiments of the embedded stressor of the present invention are described in conjunction with FIGS. 6A-7. Embodiments of methods of making the embedded stressor structures of the present invention are described in conjunction with FIGS. 8A-15B.

Figure 1:
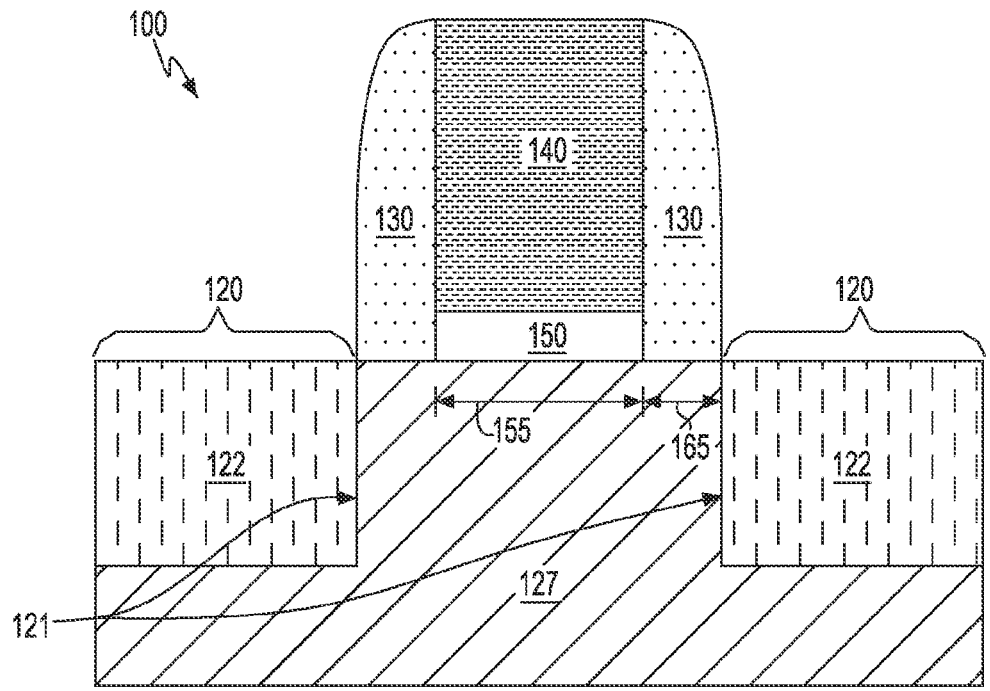
FIG. 1 illustrates an FET having a known, rectangular embedded alloy structure.
Figure 2:
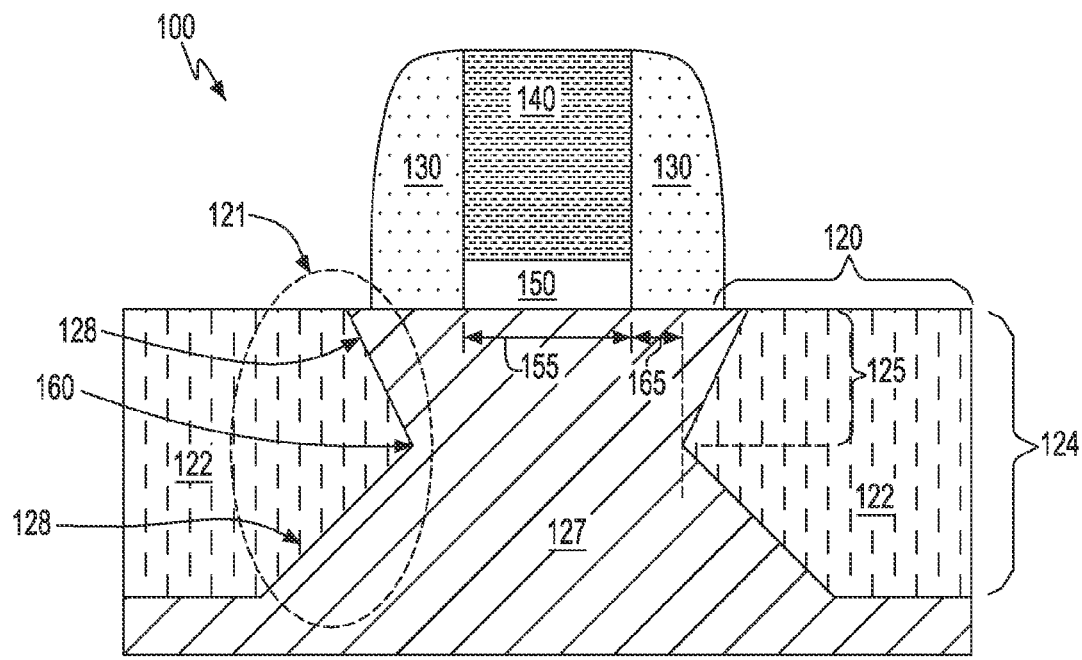
FIG. 2 illustrates an FET having a sigma-shaped embedded alloy structure with a vertex at the midpoint of the total recess depth.
Figure 3:
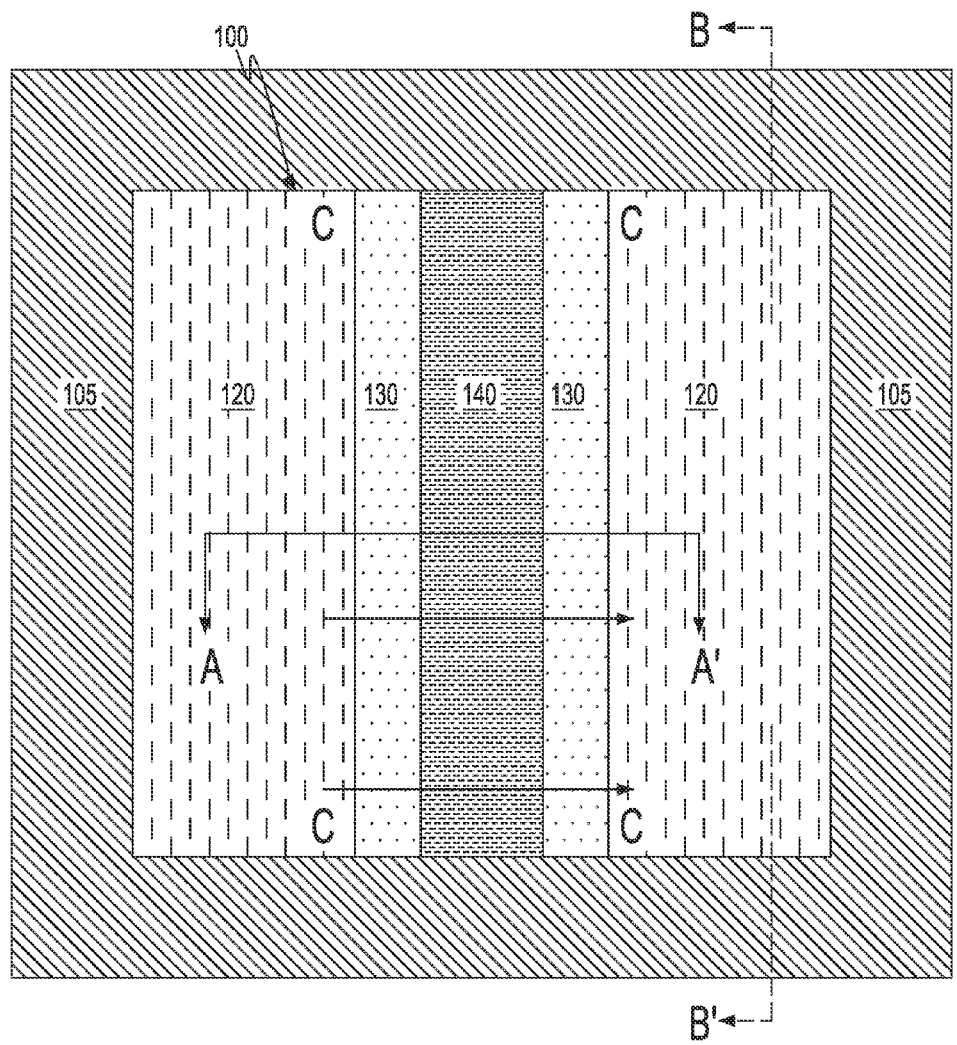
FIG. 3 is a top down illustration of a generic planar FET surrounded by isolation area.

An embodiment of the embedded stressor will be described in conjunction with FIGS. 6A and 6B. Referring to FIG. 3, FIG. 6A is a cross-section through a transistor 100 perpendicular to the gate 140. FIG. 6B is a cross-section through a transistor parallel to the gate 140 and along source-drain region 120. Turning to FIG. 6A, features of an embodiment of a sigma-shaped embedded stressor of the current invention are a gate 140 over a gate dielectric 150. The gate 140 is flanked by first spacers 130. The gate is on a substrate 127 which has an embedded stressor 122. The area of the substrate 127 under the gate dielectric 150 is the channel 155 which has a channel width which is defined by the width of the gate dielectric 150. The embedded stressor 122 has a sidewall adjacent the channel region and is referred to herein as channel sidewall 121. The channel sidewall 121 of the embedded stressor 122 includes at least one facet 128 which creates a vertex 160. The embedded stressor 122 has a total recess depth 124. The vertex 160 has a vertex depth 125.

Figure 4:
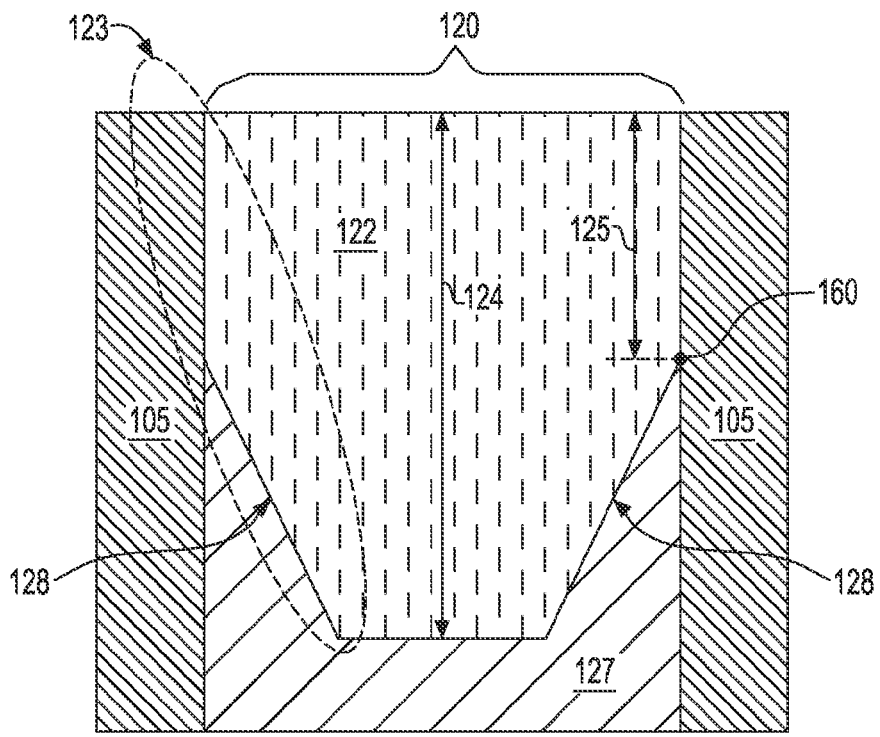
FIG. 4 is a cross-section along the source-drain region of an FET and illustrates an embedded alloy having facets on an isolation sidewall of the alloy.
Figure 5:
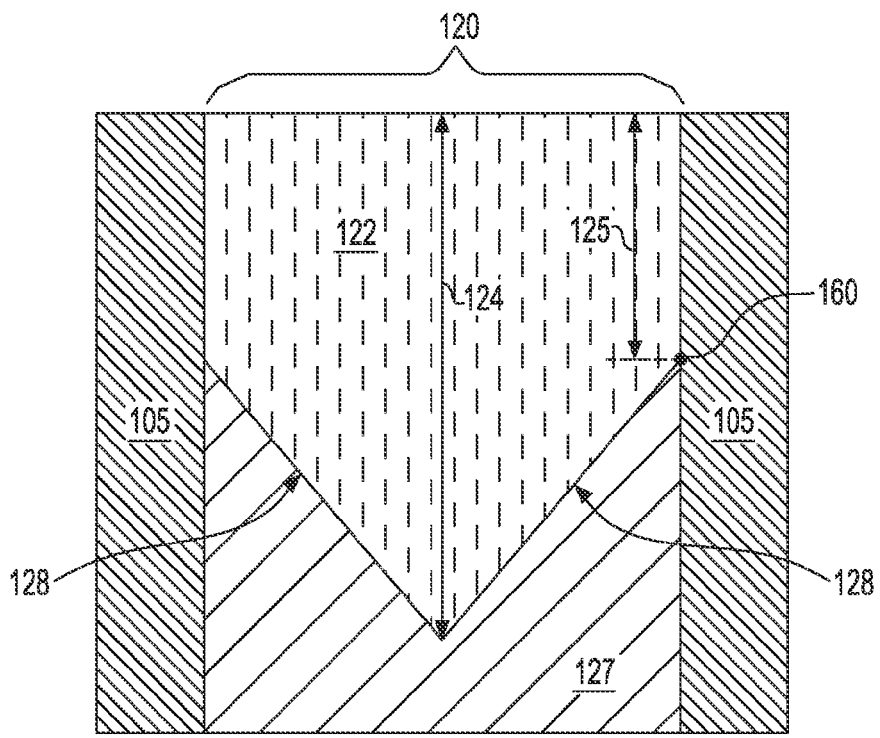
FIG. 5 is a cross-section along the source-drain region of a narrow channel FET and illustrates an embedded alloy having facets which form a pyramid pit.

Referring to FIG. 6B, the source-drain 120 region of the transistor abuts an isolation region 105. The embedded stressor 122 has an isolation sidewall 123 total recess depth 124. The isolation sidewall 123 of the embedded stressor 122 substantially lacks facets, therefore, there is no vertex associated with this plane of the device. Accordingly, a greater volume (or area when viewed in cross-section) of stressor material (alloy) is achievable with the present invention compared with a similar view of the prior art in FIGS. 4 and 5. Because the embodiment of the inventive structure illustrated in FIG. 6B substantially lacks facets, the non-uniforms stress problem explained in conjunction with FIG. 3 areas labeled "C" is alleviated. With the present invention, the corners of the transistor will have the substantially the same volume of embedded stressor 122 along the gate 140, thus a uniform stress is applied to the channel 155. Therefore, when using the embedded stressor structure of the present invention, referring to FIG. 3, channel stress (and hence speed) in area indicated by an arrow from A to A', is substantially the same as channel stress (and hence speed) in an area indicated by an arrow from C to C. Accordingly, a structure which provides a uniform channel stress along the gate length is provided in FIG. 6B.

It should be noted, that while an isolation sidewall 123 has been described in conjunction with FIG. 6B (a cross-section along the source-drain 120 region parallel to the gate), an isolation sidewall 123 also exists on an embedded stressor 122 on a cross section perpendicular to the gate. For, example, referring to FIG. 3, if the line A-A' was extended to the isolation regions 105, an isolation sidewall 123 is present. Thus in the present invention, an embedded stressor 122 of the source-drain region 120 is laterally asymmetric. Meaning, in a cross-section perpendicular to gate 140, the channel sidewall 121 has facets 128 forming a sigma-shape while the isolation sidewall 123 is vertical and substantially lacks facets.

Regardless of location of the isolation sidewall 123, isolation sidewalls 123 are preferably are facet-free. Referring to FIG. 6C, a small facet can exist at the bottom, however, as long as it does not substantially affect the volume stressor material adjacent the channel 155 (i.e. the volume of embedded stressor 122 is only slightly diminished at points "C" in FIG. 3). For instance, a bottom facet 128b or any bottom morphology having a length 128L less than about 10% of a width of the source-drain 120 region would not substantially affect the volume of stressor material adjacent the channel 155. Accordingly, an isolation sidewall 123 having a bottom facet or morphology 128b whose length 128L is less than about 10% of the width of the source-drain 120 region would be considered substantially facet free.

FIG. 7 is a magnified of a portion of the embedded stressor structure of FIG. 6A. Details of the structure and materials will be given with reference to FIG. 7. The gate 140 may be a dummy gate or an active gate. If an active gate, the gate can include silicon, preferably polysilicon, or the gate can be a metal gate such as W, WN, TiN, TaN, Al, TaAlN, or combination of these metals. The gate dielectric 140 can include one or more layers of a silicon oxide, a silicon nitride, a silicon oxyntirde, a nitrided oxide, a high dielectric (herein "high-k") material, or combinations thereof. The first spacer 130 can include one or more layers of a silicon oxide, a silicon nitride or combinations thereof. The channel 150 for the purposes of this document will be defined as the area of the substrate 127 under the gate dielectric 150. Therefore, the width of the channel 155 is measured from the ends of the gate dielectric 150. The substrate 127 is a semiconductor substrate, preferably silicon. The substrate may be a bulk substrate, a semiconductor on insulator substrate (SOI), or other known to the industry. When the substrate 127 is a single crystalline silicon substrate, the preferred substrate 127 has a (100) plane (or {100} equivalent plane) at the top surface of the substrate 127; in such a configuration, the width of channel 155 is in the [110] direction (or <110> equivalent direction) and the facets 128 are on the (111) silicon plane (or {111} equivalent plane). In, FIG. 7, the bottom of the substrate is cut off from view such that the bottom interface of the embedded stressor 122 and the substrate 127 is not shown. The embedded stressor, 122 is preferably a material which has a lattice constant different from the substrate 127 lattice constant. Thus, if the substrate 127 is silicon, the embedded stressor 122 can include an alloy of group IVA elements of the periodic table, for example silicon germanium (SiGe) and silicon carbide (SiC). In a preferred embodiment, the embedded stressor 122 of a pFET device is SiGe. In another preferred embodiment, the embedded stressor 122 of an nFET device is SiC. In FIG. 7, the embedded stressor 122 is shown to be co-planar with the surface of the substrate 127. However, other embodiments include an embedded stressor 122 whose top surface is above the top surface of the substrate 127. The embedded stressor 122 comprises at least a portion of the source-drain 120 region of the transistor, and preferably the embedded stressor 122 comprises the entire width of the source-drain region 120.

Still referring to FIG. 7, the embedded stressor 127 has a vertex 160 which has a lateral offset 165 from the gate dielectric 150/channel 155 from about −5 nm to about 10 nm and ranges there between. Here, the negative number indicates that the vertex 160 can actually penetrate under the gate dielectric 150. Thus, negative lateral offsets 165 indicate that the vertex is under the gate dielectric 150 and positive lateral offsets 165 indicate the vertex 160 is outside the gate dielectric 150. The amount of lateral offset 165 can be controlled by the thickness of first spacer 130 and/or by the amount of anisotropic etch which is further discussed when describing an embodiment of the method. The lateral position of the vertex 160 can also be described by the amount of spacer undercut 170. The vertex 160 may undercut 170 the first spacer 130 from about 5 nm to about 15 nm and ranges there between. The vertex 160 has a vertical offset or vertical depth 125. Here, the vertical depth 125 is less than about half the total recess depth 124. The depths, vertical 125 or total recess 124, are measured relative to the top of the substrate, regardless if the embedded stressor 122 is co-planar with the substrate 127 or is raised above the top of the substrate 127. The vertical depth 125 can be anywhere along the total recess depth as the vertex 160 position is determined by a second etch as will be discussed in more detail later. However, the vertical depth 125 of the vertex 160 is preferably less than about half the total recess depth 124 and ranges there between, and even more preferably less than about one-third of the total recess depth 124. Thus, in a preferred embodiment, the embedded stressor 122 of the source-drain region 120 is vertically asymmetric. Meaning, from the midpoint (See, "M" in FIG. 6A) of the total recess depth 124, the top of the embedded stressor (the region above the midpoint) has different shape than the bottom (the region below the midpoint). The total recess depth 124 can be from about 50 nm to about 100 nm and ranges there between. The vertex depth 125 can be from about 10 nm to about 30 nm and ranges there between.

An embodiment of a method of making an embedded stressor and resulting structure of the present invention will be described in conjunction with FIGS. 8A-14B, and another embodiment is described in conjunction with FIGS. 15A-15B. Figures with an "A" suffix denote cross-sections perpendicular to the gate 140 and figures with a "B" suffix denote cross-sections parallel to the gate 140 and along the source-drain region 120 (see. FIG. 3). Reference numerals are repeated and have the same explanations as previously described in conjunction with earlier figures; the explanations will not be repeated here.

Figure 8A:
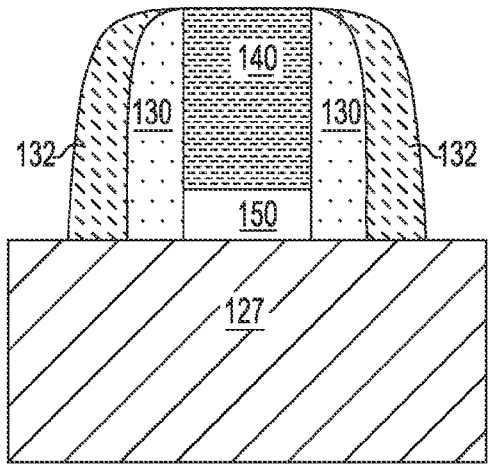
FIG. 8A illustrates a cross-section of a substrate perpendicular to a gate of an FET according an embodiment of a method step in the present invention.
Figure 8B:
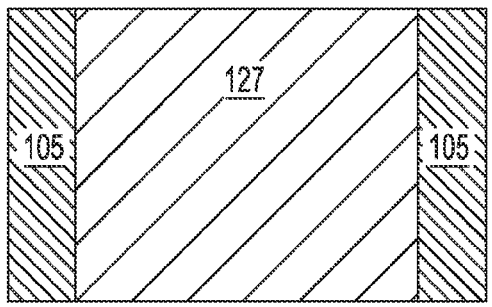
FIG. 8B illustrates a cross-section parallel to a gate of an FET along a source-drain region of the substrate according an embodiment of a method step in the present invention.

Referring to FIGS. 8A and 8B, the method starts by providing substrate 127 having a gate dielectric 150 above it, and in turn, a gate 140 above the gate dielectric 150. The gate 140 can have an etch stop layer (not shown) on top of it. The gate 140 is flanked by first spacer 130, which in turn is flanked by a second spacer 132. Second spacer 132 may be one or more layers of a silicon oxide, silicon nitride, silicon oxynitride, doped oxide, doped nitride or combinations thereof. Preferably, the material of second spacer 132 is different from first spacer 130. The substrate 127 has an adjacent isolation region 105 (See FIG. 8B).

Figure 9A:
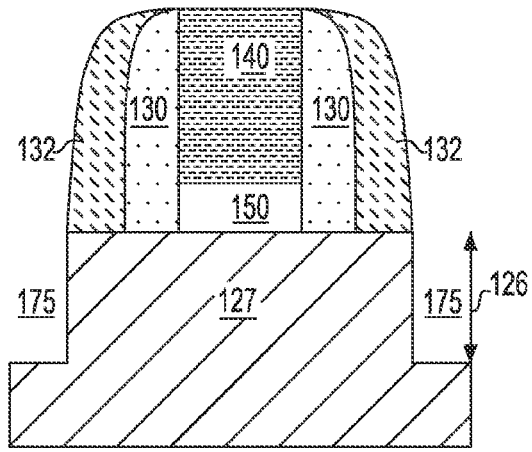
FIG. 9A illustrates a cross-section of a substrate perpendicular to a gate of an FET after a first etch according an embodiment of a method step in the present invention.
Figure 9B:
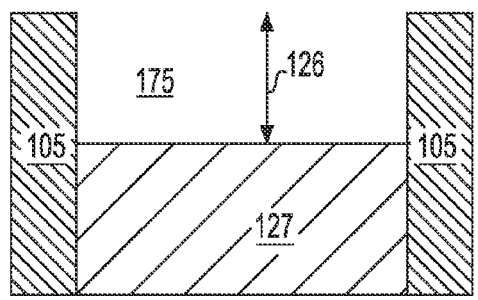
FIG. 9B illustrates a cross-section parallel to a gate of an FET along a source-drain region of the substrate after a first etch according an embodiment of a method step in the present invention.

Referring to FIGS. 9A and 9B, a first etch of the substrate 127 to a first depth 126 is preformed. The gate 140 (with optional etch stop layer) and second spacer 132 act as masks during the first etch. The first etch creates a recess 175 in the substrate 127. An anisotropic dry etch such as reactive ion etching is preferably used to recess the substrate to the depth 126. The reactive ion etching for example in a halogen-based plasma, such as $Cl_2$, HBr, or $CF_4$ plasma.

Figure 10A:
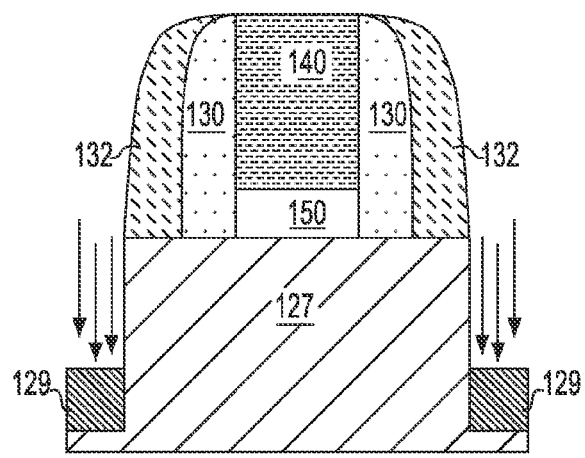
FIG. 10A illustrates a cross-section of a substrate perpendicular to a gate of an FET during substrate modification according an embodiment of a method step in the present invention.
Figure 10B:
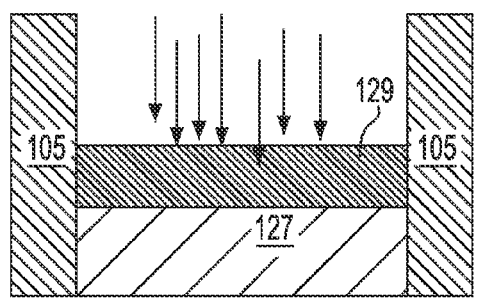
FIG. 10B illustrates a cross-section parallel to a gate of an FET along a source-drain region of the substrate during substrate modification according an embodiment of a method step in the present invention.

Referring to FIGS. 10A and 10B, the substrate 127 at the bottom of the recess 175 is modified to create a modified portion 129 of the substrate 127. Preferably, modification takes place by ion implantation. When ion implantation is used to modify the substrate 127 at the bottom of the recess 175, an element such as boron is preferred. The first depth 126 of the recess 175 is substantially the same after the modification step as it was prior to the modification step.

Referring to FIGS. 11A and 11B, the second spacer 132 has been removed. Second spacer 132 had previously served as a mask during formation of recess 175. Removal of the second spacer 132 reveals an uncovered portion 180 of the substrate adjacent the first spacer 130 and proximate the gate dielectric 150 and channel 155.

Referring to FIGS. 12A and 12B, a second etch etches the substrate 127 including the uncovered portions 180 and the modified portion 129. The second etch creates a step in the substrate 127 having a step depth 125. This depth of the second etch (step depth 125) will also be referred to as the vertex depth 125, because, as will be shown later, it is this second etch depth which determines the vertex depth 125. Because the second etch also etches a portion of the modified substrate 129, the total recess depth 124 is now equal to the sum of the first depth 126 plus the vertex depth 125. The recess is formed preferably using reactive ion etching. Note that in FIG. 12B there is no step because there was no mask (second spacer 132) covering this area.

Figure 13A:
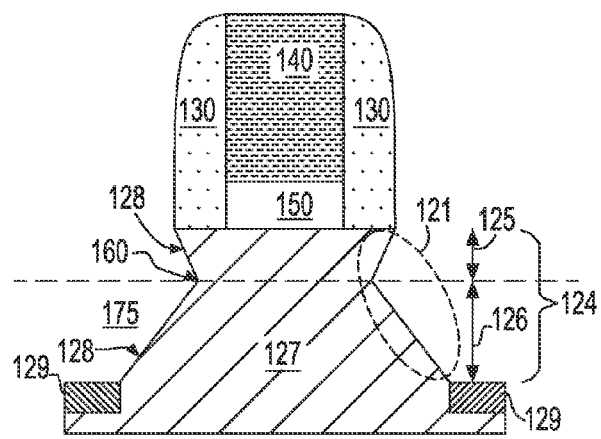
FIG. 13A illustrates a cross-section of a substrate perpendicular to a gate of an FET after an anisotropic etch according an embodiment of a method step in the present invention.
Figure 13B:
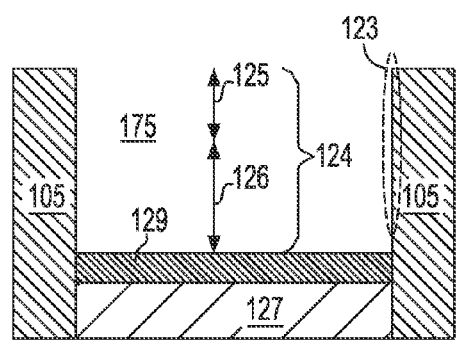
FIG. 13B illustrates a cross-section parallel to a gate of an FET along a source-drain region of the substrate after an anisotropic etch according an embodiment of a method step in the present invention.

Referring to FIGS. 13A and 13B, an anisotropic etch etches the substrate 127, but does not substantially etch the modified portions 129 of the substrate. Referring to FIG. 13A, the anisotropic etch removes some crystal planes preferentially to other crystal planes to form facets 128. In the case of a silicon substrate, the anisotropic etches removes the (111) plane (and equivalent planes) at a slower rate, thus a vertex 160 is formed where two facets of the (111) planes intersect. The vertex 160 has a vertex depth 125 determined by the second etch described in conjunction with FIGS. 12A and 12B. The vertex 160 has a lateral offset 165 and spacer undercut 170 which is a function of both the thickness of spacer 132 and the vertex depth 125. Specifically, the function according to the vertex depth 125 can be expressed as undercut 170 is equal to a function of vertex depth 125 times the tangent of 54.74°. Meanwhile, referring to FIG. 13B, there is no vertex because there was never a step. Or stated another way, the recess 175 in FIG. 13B remains unchanged because there is nothing for the anisotropic etch to remove: the isolation regions 105 and the modified portion 129 of the substrate 127 are not affected by the anisotropic etch. In a preferred embodiment, the anisotropic etch is a wet etch based on tetra-methyl ammonium hydroxide (herein, "TMAH"). Notice that the sidewall 123 of the recess 175 adjacent the isolation region 105 is vertical. In contrast, referring back to FIG. 13A, the recess 175 now has a sidewall on the channel side 121 of the substrate 127 which has a sigma-shape.

Figure 14A:
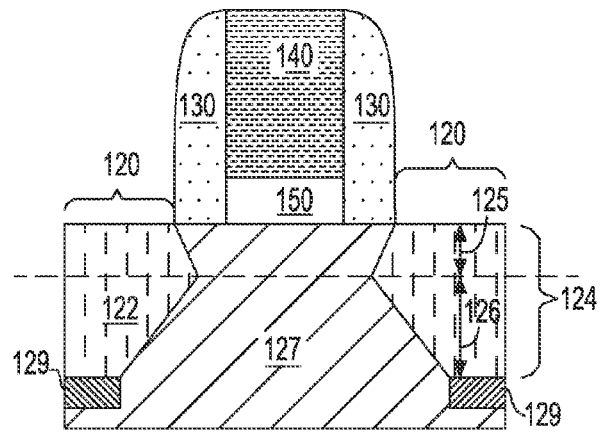
FIG. 14A illustrates a cross-section of a substrate perpendicular to a gate of an FET after embedded stressor formation according an embodiment of a method step in the present invention.
Figure 14B:
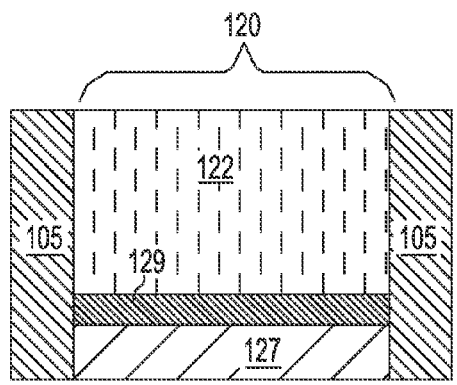
FIG. 14B illustrates a cross-section parallel to a gate of an FET along a source-drain region of the substrate after embedded stressor formation according an embodiment of a method step in the present invention.
Figure 15A:
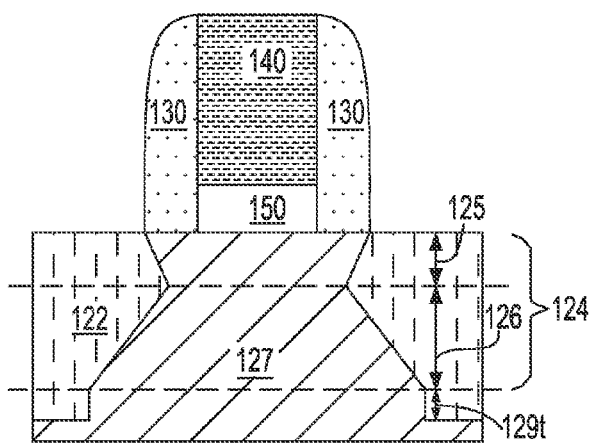
FIG. 15A illustrates a cross-section of a substrate perpendicular to a gate of an FET after embedded stressor formation according an another embodiment of the present invention.
Figure 15B:
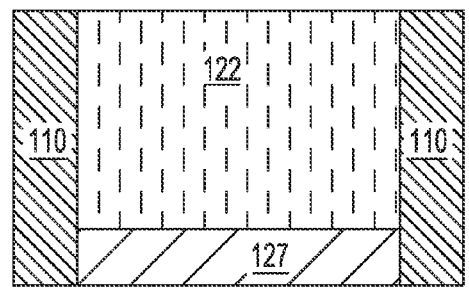
FIG. 15B illustrates a cross-section parallel to a gate of an FET along a source-drain region of the substrate after embedded stressor formation according another embodiment of the present invention.

Referring to FIGS. 14A and 14B, an embedded stressor 122 (previously described in conjunction with FIG. 7) is formed in recess 175 to form source-drain regions 120 of the device. The embedded stressor is preferably epitaxially grown. In FIGS. 14A and B, the modified portion 129 of the substrate is still present. In an alternative embodiment, prior to forming embedded stressor 122, the modified portion 129 of the substrate 127 may be removed, for example, by reactive ion etching. Such an embodiment is illustrated in FIGS. 15A and 15B. In the embodiment of FIGS. 15A and 15B, the total recess 124 is now equal to the sum of the vertex depth 125, first depth 126 and the removed modified substrate thickness 129t.

The present invention has the advantage that the location of the vertex 160 can be controlled both laterally relative to the channel 155 and vertically relative to the channel 155. Lateral offset and spacer undercut is controlled by first spacer 130 thickness and by anisotropic etch time. Vertical offset, of vertex depth 125, is controlled by the second etch of the substrate which created a step.

The present invention has the additional advantage that no vertex is formed on an isolation sidewall 123 of the embedded stressor. Instead, the isolation sidewall is substantially facet free. As a result, a larger volume of stressor material is available to create more strain in the channel 155.

The substantially facet free isolation sidewalls 123 of the present invention also have the advantage of creating a more uniform stress along the entire length of gate 140 and source-drain region 120, even at the corners (see FIG. 3).

Finally, with respect to narrow channel devices, the present invention offers the advantage that a larger volume of stressor can be created does not limit the total recess depth 124. In addition, the process creates a narrowed channel device structure which provides a uniform channel stress along the gate length.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

What is claimed is:

1. A method of making a semiconductor device, the method comprising:
    forming a gate on a substrate, the gate having a first spacer on a sidewall of the gate and a second spacer on the first spacer;
    forming a recess in a substrate wherein the recess has a channel sidewall;
    after forming the recess, removing the second spacer to form an uncovered portion of the substrate adjacent the first spacer;
    etching the uncovered portion of the substrate to form a step in the recess having a step depth; and
    after forming the step, forming a pair of facets on the channel sidewall wherein the facets form a vertex.

2. The method of claim 1, wherein the substrate comprises a semiconductor.

3. The method of claim 1, wherein the vertex is located at the step depth.

4. The method of claim 1 wherein a facet on the channel sidewall extends from the vertex to a point wherein the first spacer meets the substrate.

5. The method of claim 1, further comprising:
    modifying the substrate at a bottom of the recess prior to forming the pair of facets.

6. The method of claim 1 the vertex is at a vertex depth greater than 10.5 nm and less than about 50% of a total recess depth.

7. The method of claim 1, wherein forming the pair of facets further comprises anisotropic etching.

8. The method of claim 1, further comprising forming a semiconductor alloy in the recess.

9. The method of claim 8 wherein the alloy has a lattice spacing different than that of the substrate.

10. A method of making semiconductor device having an embedded stressor including a sigma-shaped channel sidewall under a gate, the method comprising:
    forming a first recess in a source drain region of a semiconductor substrate wherein the first recess has a first depth;
    removing a mask;
    further etching the recess to a second depth, different from the first depth, by vertical etch;
    after further etching the recess to the second depth, anisotropic etching the recess to form a pair of facets under the gate thereby forming
    a sigma-shaped sidewall of the recess under the gate with a vertex of the sigma-shaped sidewall being at a vertex depth less than one-third of a total recess depth; and
    forming an alloy in the recess having the sigma-shaped sidewall.

11. The method of claim 10 wherein the alloy has a lattice spacing different than that of the substrate.

12. A method of making a semiconductor device, the method comprising:
    forming a recess in a substrate wherein the recess has a channel sidewall and an isolation sidewall; and
    forming a pair of facets on the channel sidewall wherein the facets form a vertex having a vertex depth greater than 10.5 nm and less than about 50% of a total recess depth and wherein the facets are on equivalent crystal planes.

13. The method of claim 12 wherein the vertex depth is less than about 33% of the total recess depth.

14. The method of claim 12 wherein the vertex depth is from greater than 15 nm to about 30 nm.

15. The method of claim 12, further comprising forming a gate dielectric wherein the vertex has lateral offset from the gate dielectric, wherein the lateral offset is less than about 10 nm.

16. The method of claim 12 further comprising forming a gate dielectric comprising a high dielectric constant material.

17. The method of claim 12 further comprising forming a gate comprising at least one of W, WN, TiN, TaN, Al, and TaAlN.

18. The method of claim 12 further comprising forming a spacer adjacent a gate wherein the vertex undercuts the spacer by about 5 nm.

19. The method of claim 12 further comprising forming a semiconductor alloy in the recess wherein the semiconductor allow has a lattice offset different from that of the substrate and wherein the semiconductor alloy includes at least one of silicon, germanium and/or carbon.

20. The method of claim 19 wherein forming the semiconductor alloy further comprises forming the semiconductor alloy above a top surface of the substrate.

* * * * *